United States Patent [19]

Kadota

[11] 4,291,285

[45] Sep. 22, 1981

[54] SURFACE ACOUSTIC WAVE DEVICE AND METHOD OF MANUFACTURING

[75] Inventor: Michio Kadota, Kyoto, Japan

[73] Assignee: Murata Manufacturing Co., Ltd., Japan

[21] Appl. No.: 120,784

[22] Filed: Feb. 12, 1980

[30] Foreign Application Priority Data

Feb. 22, 1979 [JP] Japan .................................. 54-20455

[51] Int. Cl.³ ........................ H03H 9/05; H03H 9/09; H03H 9/10; H03H 9/145
[52] U.S. Cl. ................................. 333/150; 29/25.35; 310/313 R; 310/340; 310/348; 333/151; 333/194
[58] Field of Search ............................. 333/150-155, 333/191-196, 186; 310/313 R, 313 A, 313 B, 313 C, 313 D, 340-356, 365-366, 363-364; 29/25.35, 294; 174/52 R, 52 FP

[56] References Cited

U.S. PATENT DOCUMENTS 3,872,331 3/1975 Falco .............................. 310/344 X
3,885,173 5/1975 Lee .................................. 310/345 X Primary Examiner—Marvin L. Nussbaum
Attorney, Agent, or Firm—Ostrolenk, Faber, Gerb & Soffen

[57] ABSTRACT

A transducer region and lead-out electrodes connected to the transducer region are formed on one main surface of a surface acoustic wave substrate and a sheet having a thickness directionally conductive property and a plane directionally insulating property is layered on the one main surface of the substrate through a spacer. The spacer achieves a function for forming a necessary gap in the transducer region between the sheet and the substrate and a function for adhering the sheet onto the substrate. The lead-out terminals are connected through the sheet to the lead-out electrodes by virtue of the thickness directional conductivity of the sheet.

18 Claims, 11 Drawing Figures

FIG.1
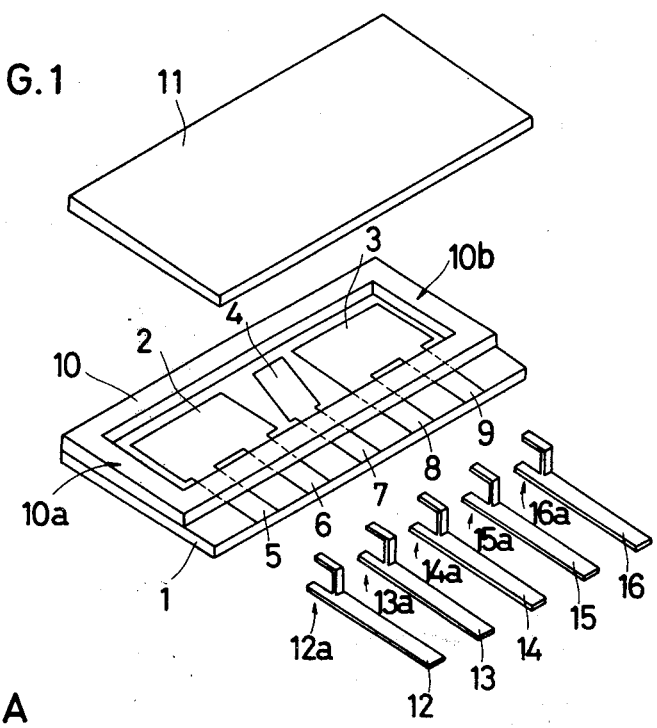
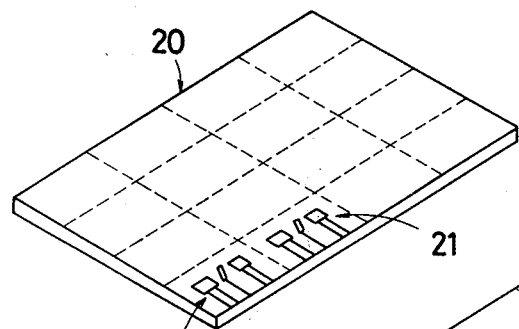
FIG.2A
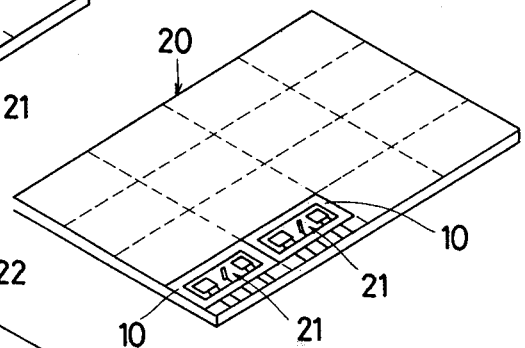
FIG.2B
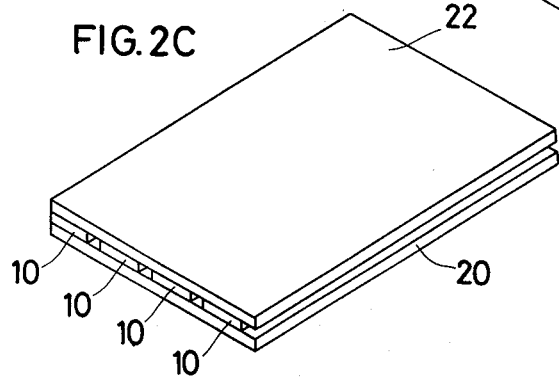
FIG.2C

SURFACE ACOUSTIC WAVE DEVICE AND METHOD OF MANUFACTURING

BACKGROUND OF THE INVENTION

1. Field of the Invention

The present invention relates to a surface acoustic wave device and a method of manufacturing the same. More specifically, the present invention relates to a surface acoustic wave device having an improved structure and a method for manufacturing the same.

2. Description of the Prior Art

Since a surface acoustic wave device has superior electrical characteristics, such as frequency characteristic and the like, as compared with many other devices, recently, attempts have been made to put the same into practical use in various fields. Such a surface acoustic wave device requires a package such as a hermetic seal structure, a resin mold structure and the like which are well-known. However, a difficulty of fabrication thereof peculiar to a surface acoustic wave device has been a hindrance to an improvement in mass productivity of a surface acoustic wave device having a package structure, which has been one cause that makes it difficult to reduce the cost of such a device.

For example, in case of a hermetic seal structure, wire bonding is employed for connection from an element to leadout terminals connecting to an external circuit. Although automation technology for such wire bonding has been considerably advanced, a satisfactory yield has not been yet attained. In the case of a surface acoustic wave device, the elements to be wire bonded are formed of the same electrode material define a transducer region, i.e., an interdigital electrode. Such electrode material is not necessarily a material which is suited for wire bonding and thereto it is necessary to carefully select a material for wire bonding. Since such wire bonding is effected before an element or substrate is packaged, such wire bonding work can exert an unfavorable influence upon an interdigital transducer. If and when an interdigital transducer is subjected to moisture or is damaged during wire bonding work, adjacent electrode fingers of the interdigital electrode can be short-circuited, with the result that the electrical characteristic of the wave device is degraded and cannot be used in extreme cases.

When a package is formed by means of resin dipping, lead-out terminals must be soldered directly to the lead-out electrodes of an element or substrate before the resin dipping process is initiated. Since the substrate is exposed in such a case, the interdigital transducer may be damaged during the soldering process. Furthermore, in case of resin dipping, if and when dipping resin is adhered to a propagation region of a surface acoustic wave of the interdigital transducer, the resin may excert an unfavorable influence upon the characteristics and in order to avoid such influence it has been a common practice that the substrate is provided with a cap to form a necessary gap and is subjected to resin dipping. However, even in case of resin dipping of a device as capped, again an interdigital transducer is liable to be damaged by such a cap and is also liable to get wet. Furthermore, it is difficult to automate the above described soldering process of lead-out terminals. Nevertheless, if such a process is automated, then again an interdigital transducer is more liable to be damaged.

SUMMARY OF THE INVENTION

In order to eliminate the above described problems, the present invention employs a sheet material having a thickness directionally conductive property and a plane directionally insulating property for the purpose of external connection of lead terminals to lead electrodes of an interdigital transducer. Such sheet material is layered on one main surface of a substrate having an interdigital transducer and a lead-out portion thereof formed. A spacing member is interposed between the substrate and the sheet member excluding an area associated with the lead-out portion. The lead-out terminals are electrically connected to the lead-out portion through the sheet.

According to the present invention, it is possible to mount lead-out terminals and form a package on a composite including a substrate having an interdigital transducer formed thereon and covered with a sheet material, whereby the interdigital transducer is prevented from being damaged or getting wet with moisture. Accordingly, the yield of the inventive devices in a manufacturing process is drastically improved. In addition, since the structure is simple, the process for fabricating invention can be simplified and the mass productivity is enhanced. Accordingly, the surface acoustic wave devices made in accordance with the present invention are very inexpensive compared with conventional surface acoustic wave devices.

In a preferred embodiment of the present invention, the spacing member is made of an acoustic absorbing material. Such an acoustic absorbing material is formed on a region where an unnecessary surface acoustic wave is propagated. According to such an embodiment, the spacing member serves as an acoustic absorbing material and any necessity for providing a particular acoustic absorbing material is eliminated.

In a further preferred embodiment of the present invention, since external lead-out terminals are adapted to nip the laminated substrate and sheet, a soldering process which was conventionally required for connecting the lead-out terminals is eliminated. Accordingly, automation can be made with ease.

Accordingly, a principal object of the present invention is to provide an improved surface acoustic wave device and a method of manufacturing the same.

Another object of the present invention is to provide a surface acoustic wave device having a novel structure and a method for manufacturing the same.

A further object of the present invention is to provide a surface acoustic wave device having a structure which lends itself to mass productivity and a method of manufacturing the same.

Still a further object of the present invention is to provide a surface acoustic wave device having a structure enabling simplicity of a fabrication process and a method for manufacturing the same.

Still another object of the present invention is to provide a method for manufacturing with an excellent mass productivity a surface acoustic wave device having a novel structure.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an exploded perspective view of one embodiment of the present invention;

FIGS. 2A to 2D are perspective views showing a process for fabricating the FIG. 1 embodiment;

FIGS. 5A and 5B are views showing a further embodiment of the present invention, wherein FIG. 5A is an exploded perspective view of the embodiment, and FIG. 5B is a cross sectional view of the embodiment, as packaged.

DESCRIPTION OF THE PREFERRED EMBODIMENTS

Figure 2D:
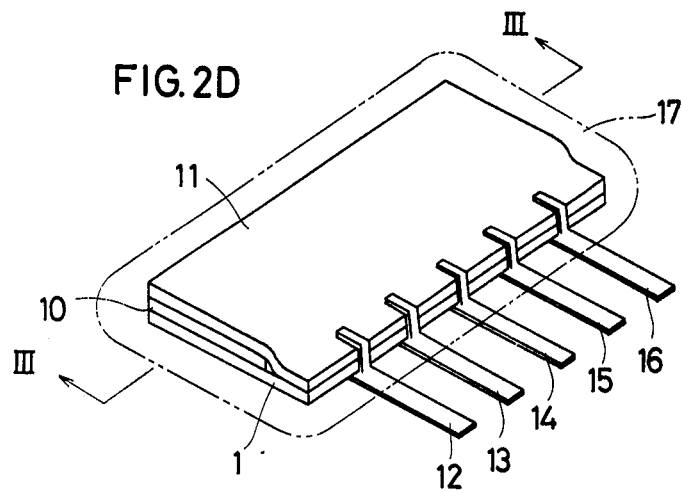

FIG. 1 is a perspective view showing one embodiment of the present invention, as partially diassembled. A substrate 1 has interdigital transducers 2 and 3 formed thereon, spaced apart a suitable distance in a propagating direction of a surface acoustic wave, as well known to those skilled in the art. A ground electrode 4 is formed between the interdigital transducers 2 and 3. Since the details of the electrode patterns of these interdigital transducers 2 and 3 and the operation thereof are well known, a detailed description thereof is omitted.

The substrate 1 also has lead-out electrodes 5 and 6 formed thereon extending from the interdigital transducer 2 to the end edge of the substrate 1. Similarly, a lead-out electrode 7 is formed extending from the ground electrode 4 and lead-out electrodes 8 and 9 are formed extending from the interdigital transducer 3 to reach the same end edge of the substrate which the lead-out electrodes 5 and 6 reach. These lead-out electrodes 5 to 9 serve as a withdrawing portion and are to be electrically connected to lead-out terminals 12 to 16 described below.

An adhesive agent 10 (serving as an interposing member) is formed by means of printing, for example, on the substrate 1 so as to encompass the propagating path of a surface acoustic wave between the interdigital transducers 2 and 3, excluding that portion of the lead-out electrodes 5 to 9 located at the end edge of the substrate. The adhesive agent 10 may be a viscous adhesive agent, for example, silicon rubber, and is used to adhere a sheet 11 described below to the substrate 1 and to form a necessary gap between the sheet 11 and the substrate 1 at the region of the interdigital transducers 2 and 3. If and when the adhesive agent 10 has an acoustic absorbing property, then the adhesive agent also serves to absorb unnecessary surface acoustic waves. If the adhesive agent 10 is one that has no acoustic absorbing property, a separate acoustic absorbing material such as silicon rubber may be formed on a region where unnecessary surface acoustic waves propagates. If and when at least portions 10a and 10b of the adhesive agent 10 are made of an acoustic absorbing material, unnecessary surface acoustic waves excited by the interdigital transducers 2 and 3 could be effectively absorbed even if the remaining portions are not made of an acoustic absorbing material.

A sheet 11 having a thickness directionally conductive or a pressure sensitive conductive property is laminated on the composite of the substrate and the adhesive agent layer 10 formed thereon, as shown in FIG. 1. As the thickness directionally conductive sheet, a sheet comprising a mixture of metal powder in silicon rubber, a sheet comprising graphite fibers, thin metallic wires and the like embedded in silicon rubber in the thickness direction thereof, and the like have been proposed and put into practical use. Such sheets exhibit an electrically conductive property in the direction of thickness of the sheet at any given position and also exhibit an insulating property in the direction of expansion or plane direction of the sheet. If and when a sheet 11 having a pressure sensitive thickness directionally conductive property is employed, the sheet 11 has an electrical conductivity in the thickness direction upon application of pressure in the thickness direction and also has an insulating property in the expansion or plane direction of the sheet. An example of a thickness directionally conductive rubber sheet having a thickness of 0.2 mm presently available exhibits a resistance of 0.6 to 1.9 $\Omega/mm^2$ upon application of a pressure of 74 $g/mm^2$ in the thickness direction and an insulating resistance of larger than $2 \times 10^9 \Omega$ between the adjacent electrodes. An example of a pressure sensitive electrically conductive rubber sheet presently available exhibits an abrupt decrease of the resistivity from $10^8 \Omega$ cm to $10^2 \Omega$ cm at a portion where pressure of say 40 $g/cm^2$ is applied in the thickness direction. A sheet 11 of such a material is adhered or tentatively adhered onto the substrate 1 by means of the adhesive agent 10.

Lead-out terminals 12 to 16 are prepared corresponding to the withdrawing portions 5 to 9. One end of each of the lead-out terminals 12 to 16 is partially bent to form a bifurcate shaped nipping portion as at 12a to 16a. The nipping portions 12a to 16a are each rendered electrically conductive to the corresponding one of the withdrawing portions 5 to 9 through the sheet 11 at the corresponding position of the withdrawing portions 5 to 9. More specifically, the respective lead-out terminals 12 to 16 are each rendered electrically conductive to the corresponding ones of the withdrawing portions 5 to 9 underlying the sheet by virtue of the thickness directionally conductive property of the sheet 11 and as a result the interdigital transducers 2 and 3 and the ground electrode 4 are electrically connected to the corresponding terminals 12 to 16 through the withdrawing portions 5, 6, 8, 9 and 7 and through the sheet 11. Meanwhile, the nipping portions 12a to 16a of the terminals 12 to 16 are preferably selected to nip both the substrate 1 and the sheet 11 with a predetermined nipping force being exerted in the thickness direction.

The composite thus obtained comprising the substrate 1, the adhesive agent 10, the sheet 11 and the lead-out terminals 12 to 16, as shown in FIG. 1, is then subjected to resin dipping or resin molding, with the other end portions of the lead-out terminals 12 to 16 exposed as shown in FIG. 2D, thereby to form a resin external cover 17. In such a case, since the adhesive agent 10 has been formed to encompass the regions of the interdigital transducers 2 and 3 and the ground electrode 4, the resin is effectively prevented from undesirably flowing into the regions of the interdigital transducers 2 and 3 and a propagating path of a surface acoustic wave.

Now referring to FIGS. 2A to 2D and 3, a preferred method of manufacturing the FIG. 1 embodiment will be described.

First referring to FIG. 2A, a sheet of wafer substrate 20 is prepared and a plurality of electrically conductive patterns 21, each including electrodes and withdrawing portions of the interdigital transducers of a predetermined configuration (and an electrically conductive pattern of the ground electrode and the withdrawing portion thereof in the embodiment shown), are formed on the substrate 20. When employing, as the substrate 20, a material such as ceramic requiring a polarization process, the polarization process is effected at a proper time before or after formation of the electrically conductive patterns 21.

Now referring to FIG. 2B, the layer 10 of an adhesive agent is formed by means of printing, for example, on each of the electrically conductive patterns 21. Meanwhile, the adhesive agent layer 10 may be configured as shown in FIG. 1.

Referring to FIG. 2C, a sheet 22 of the same configuration as that of the substrate 20 is adhered by means of the adhesive agent 10. The sheet 22 may be of the same material as the sheet 11 depicted with reference to FIG. 1. Then along the lines shown by the dotted lines in FIGS. 2A and 2B, the composite thus formed as shown in FIG. 2C is severed for each of the electrically conductive patterns 21, whereby a composite including the laminated substrate 1, adhesive agent layer 10 and sheet 11 as shown FIG. 1 is obtained.

Figure 3:
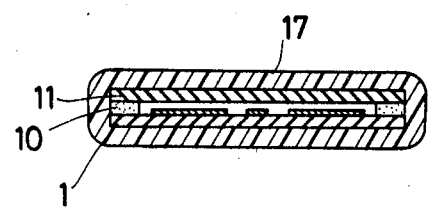
FIG. 3 is a cross sectional view taken along the line III—III in FIG. 2D.

Now referring to FIG. 2D, the lead-out terminals 12 to 16 are mounted so as to nip the substrate 1 and the sheet 11 at the corresponding respective withdrawing portions 5 to 9 (see FIG. 1). Then, as shown by the two dotted line in FIG. 2D, a resin outer cover 17 is formed by means of the well-known process such as resin dipping, resin molding, and the like. FIG. 3 shows a cross sectional view of a surface acoustic wave device of the composite completed as shown in FIG. 2D.

Figure 4:
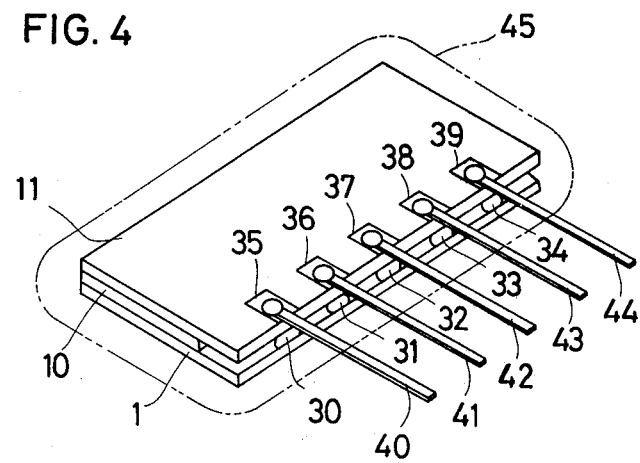
FIG. 4 is a perspective view showing another embodiment of the present invention.

FIG. 4 is an perspective view showing another embodiment of the present invention. The embodiment shown is substantially the same as the previously described embodiment (shown in FIG. 2D), except for the following points. More specifically, the FIG. 4 embodiment has an electrically conductive adhesive agent coated as at 30 to 34 on the withdrawing portions 5 to 9 (see FIG. 1). The sheet 11 is placed on the substrate 1 through the adhesive agent 10 and the electrically conductive adhesive agent as at 30 to 34. The sheet 11 has electrically conductive films 35 to 39 formed at the positions corresponding to the withdrawing portions 5 to 9, respectively. The electrically conductive films 35 to 39 are used for soldering the lead-out terminals 40 to 44. For example, the interdigital transducers 2 and 3 and the ground electrode 4 shown in FIG. 1 are electrically connected to the lead-out terminals 40, 41, 43, 44 and 42 through the electrically conductive films 35, 36, 38, 39 and 37, the sheet 11 and the electrically conductive adhesive agent layers 30, 31, 33, 34 and 32 and the withdrawing portions 5, 6, 8, 9 and 7, respectively. Then finally a resin outer cover 45 is formed through the same process as shown in FIG. 2D.

Meanwhile, a method for manufacturing the FIG. 4 embodiment would be different from that of the embodiment depicted in FIGS. 2A to 2D in the following points. More specifically, the electrically conductive films 35 to 39 are formed in advance on the sheet 11. The electrically conductive adhesive agent layers 30 to 34 are formed either before or after the adhesive agent layers 10 are coated. As described previously, the lead-out terminals 40 to 44 serve to electrically connect and mechanically fix the electrically conductive films 35 to 39 by soldering.

Figure 5A:
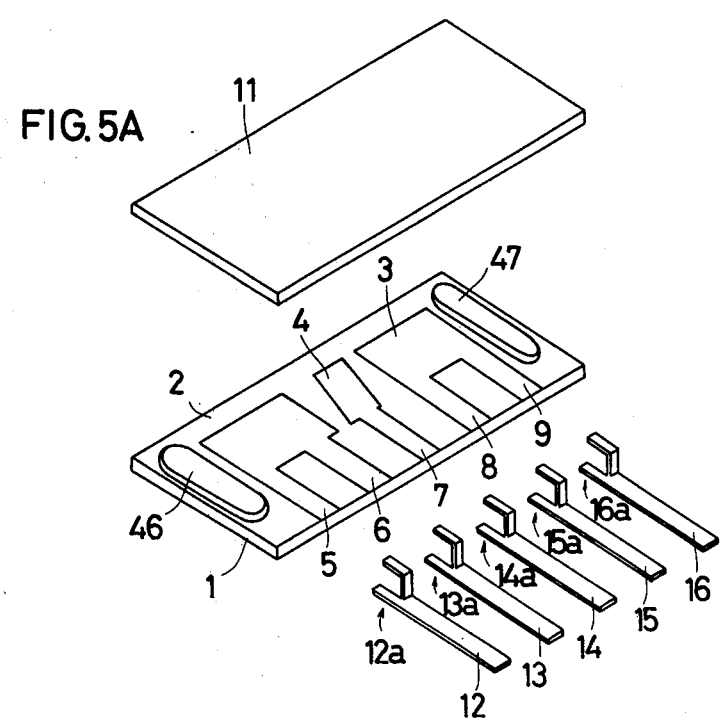
Figure 5B:
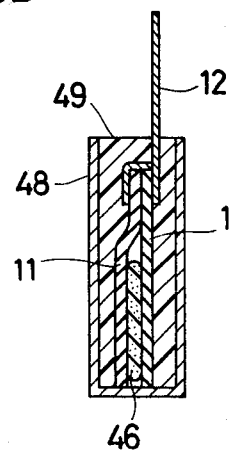

FIGS. 5A and 5B are views showing a further embodiment of the present invention. The embodiment shown are substantially the same as the embodiment shown in FIGS. 1, and 2A to 2D, except for the following points. More specifically, the embodiment shown in FIGS. 5A and 5B employs silicon rubber as at 46 and 47 rather than employing an adhesive agent as at 10 as an interposing member. The silicon rubber used as at 46 and 47 is well-known as an acoustic absorbing material and is formed at the positions corresponding to the portions 10a and 10b of the adhesive agent 10 shown in FIG. 1. In case of the embodiment shown, the sheet 11 may be fixed onto the substrate 1 by means of the silicon rubber as at 46 and 47 depending on the manufacturing process but normally the sheet 11 is fixed onto the substrate 1 by virtue of a nipping force by the nipping portions 12a to 16a of the lead-out terminals 12 to 16.

With the sheet 11 fixed to the substrate 1, the composite thus obtained is inserted into a casing 48 having one open end, with the nipping portions 12a to 16a directed toward the opening end of the casing 48. An insulating resin material 49 is then poured into the casing 48.

Figure 6A:
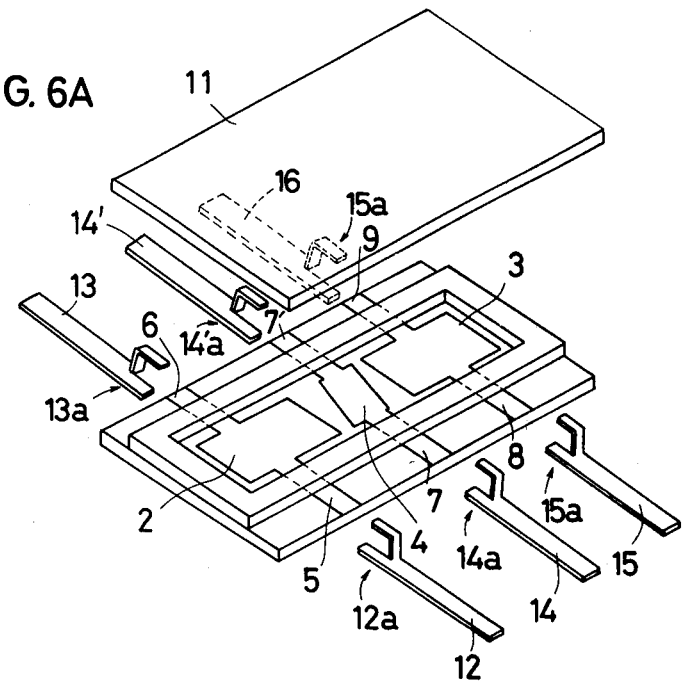
FIGS. 6A and 6B are views of still a further embodiment of the present invention.
Figure 6B:
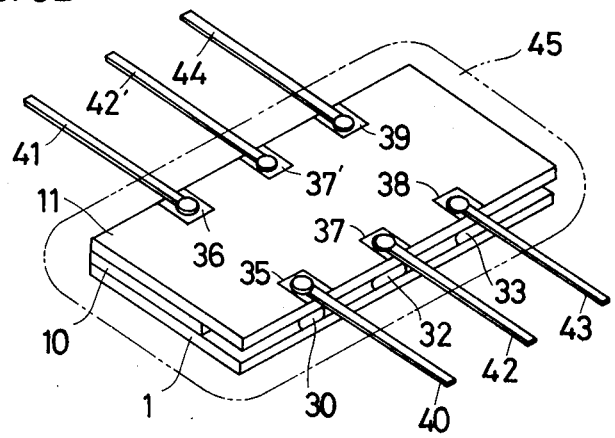

FIGS. 6A and 6B are views showing still a further embodiment of the present invention. The embodiment shown in FIGS. 6A and 6B is different from the previously described embodiments in that the lead-out terminals 12 to 16 and 40 to 44 are disposed in the so-called dual-in-line configuration. In order to dispose the lead-out terminals in the dual-in-line configuration, the withdrawing portions 5 to 9 are extended to both end edges of the substrate 1, as shown in FIG. 6A, while the ground electrode 4 is connected to an additional withdrawing portion 7' and thus to an additional electrically conductive film 37'.

Although in the previously described embodiments the package structure was described as implemented by resin dipping, resin molding, or resin pouring in a casing, the present invention is not limited to these structures and alternatively the composite may be simply housed in a casing or may be directly mounted onto a print circuit board and the like without using a package.

It is also pointed out that the sheet 11 for use in the present invention may be other than those described in the foregoing embodiments. For example, the sheet member 11 may comprise a sheet having a structure wherein electrically conductive strip regions and insulating strip regions are alternately disposed in a given plane direction in a stripe pattern. Alternately, the sheet member may be adapted to exhibit the abovedescribed propery only at a portion corresponding to the withdrawing portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device, comprising:
a substrate having a main surface, transducer means located on said main surface and connected to withdrawing means which is also located on said main surface, said withdrawing means for connecting said transducer means to an external circuit;
a sheet member mounted on said main surface of said substrate and having an electrically conductive property in a direction perpendicular to said main surface and an insulating property a direction parallel to said main surface;

an interposing member interposed between said substrate and sheet member but not interposed between a portion of said withdrawing means and said sheet member, for forming a predetermined gap between said sheet member and said transducer means; and a lead-out terminal electrically connected to said sheet member at a location which causes said lead-out terminal to be electrically connected to said withdrawing means through said sheet member by virtue of said directionally conductive property of said sheet member.

2. A surface acoustic wave device in accordance with claim 1, wherein said sheet member comprises a pressure sensitive member exhibiting an electrically conductive property in the thickness direction of said sheet member at a position corresponding to said lead-out means upon application of pressure thereto in the thickness direction.

3. A surface acoustic wave device in accordance with claim 1 wherein said sheet member is adapted to exhibit said directionally conductive property throughout the whole area of said sheet member.

4. A surface acoustic wave device in accordance with claim 1 wherein said sheet member is adapted to exhibit said property only at a position corresponding to said withdrawing means.

5. A surface acoustic wave device in accordance with any one of the preceding claims, wherein said interposing member comprises an adhesive agent serving to adhere said sheet member to said substrate.

6. A surface acoustic wave device in accordance with any one of claims 1 through 4, wherein said interposing member comprises an acoustic absorbing material having an acoustic absorbing function at least at a region where an undesired surface acoustic wave propagates.

7. A surface acoustic wave device in accordance with claim 5, wherein said interposing member is formed to encompass said transducer region.

8. A surface acoustic wave device in accordance with claim 5, which further comprising an acoustic absorbing material formed on at least a region where an undesired acoustic surface wave propagates.

9. A surface acoustic wave device in accordance with any one of claims 1 through 4, wherein said lead-out terminal comprises a nip portion for nipping said sheet member and said substrate as laminated.

10. A surface acoustic wave device in accordance with any one of claims 1 to 4, wherein said sheet member has an electrically conductive film formed on a position corresponding to said withdrawing means, and said lead-out terminal is electrically connected and mechanically fixed to said electrically conductive film.

11. A surface acoustic wave device in accordance with claim 9, wherein said withdrawing means is extended to one side edge of said substrate, and said lead-out terminal is mounted to said one side edge of said substrate.

12. A surface acoustic wave device in accordance with claim 9, wherein said withdrawing means is extended to both side edges of said substrate, and said lead-out terminal is provided in a dual-in-line fashion.

13. A surface acoustic wave device in accordance with any one of claims 1 through 4, which further comprises an outer cover formed to enclose said substrate and said sheet member.

14. A surface acoustic wave device in accordance with claim 13, wherein said outer cover comprises a resin material.

15. A surface acoustic wave device in accordance with claim 14, wherein said outer cover is formed by dipping or molding of said resin material.

16. A surface acoustic wave device in accordance with claim 14, wherein said outer cover comprises a casing and a resin material is filled in said casing.

17. A method for manufacturing a surface acoustic wave device, including a substrate having a transducer region and a withdrawing portion formed on one main surface of said substrate said withdrawing portion for connection of said transducer region to an external circuit, a sheet member mounted on said one main surface of said substrate and having an electrically conductive property in a direction perpendicular to said main surface and an insulating property in a direction parallel to said main surface, an interposing member for forming a predetermined gap between said sheet member and said transducer region and interposed between said substrate and said sheet member, but not interposed between said sheet member and a portion of said withdrawing portion, and a lead-out terminal for connection to said withdrawing portion through said sheet member, said method comprising the steps of:

preparing a composite including said substrate, said interposing member and said sheet member, and electrically connecting and mechanically fixing said lead-out terminal to the surface of said sheet member at a position corresponding to said withdrawing portion.

18. A method for manufacturing a surface acoustic wave device in accordance with claim 17, wherein said step of preparing said composite comprises the steps of:

preparing a substrate having a plurality of sets, each set having a transducer region and a withdrawing portion associated therewith, on said one main surface of said substrate;

forming said interposing member for each of said transducer region;

mounting said sheet member covering substantially the whole surface of aid one main surface of said substrate having said interposing member formed thereon, whereby an integral composite is provided; and severing said integral composite into a plurality of units, each said unit including one of said transdcer regions.

* * * * *